United States Patent
Hayk et al.

(10) Patent No.: US 10,304,917 B2
(45) Date of Patent: May 28, 2019

(54) FLEXIBLE DISPLAY DEVICE

(71) Applicant: Samsung Display Co., Ltd., Yongin-si, Gyeonggi-do (KR)

(72) Inventors: Khachatryan Hayk, Hwaseong-si (KR); Hyun Woo Koo, Hwaseong-si (KR); Tae Woong Kim, Seongnam-si (KR); Jin Hwan Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/967,349

(22) Filed: Apr. 30, 2018

(65) Prior Publication Data
US 2019/0131364 A1    May 2, 2019

(30) Foreign Application Priority Data

Oct. 26, 2017   (KR) ........................ 10-2017-0140142

(51) Int. Cl.
*H05K 1/02*   (2006.01)
*H05K 1/03*   (2006.01)
(Continued)

(52) U.S. Cl.
CPC .......... *H01L 27/3246* (2013.01); *G06F 3/047* (2013.01); *G06F 3/0412* (2013.01);
(Continued)

(58) Field of Classification Search
CPC ............. H01L 27/3246; H01L 51/5253; H01L 51/0393; H01L 51/5203; H01L 51/0096; H01L 51/0097; H01L 51/5237; H01L 51/5338; G06F 3/0412; G06F 3/047; H05K 1/0281; G02F 2201/121
See application file for complete search history.

(56) References Cited

U.S. PATENT DOCUMENTS

| | | |
|---|---|---|
| 5,448,131 A | 9/1995 | Taylor et al. |
| 7,710,370 B2 * | 5/2010 | Slikkerveer ............... G09F 9/35 345/31 |

(Continued)

FOREIGN PATENT DOCUMENTS

| | | |
|---|---|---|
| CN | 104364705 A | 2/2015 |
| KR | 10-0326532 B1 | 3/2002 |

(Continued)

*Primary Examiner* — Joseph L Williams
*Assistant Examiner* — Jose M Diaz
(74) *Attorney, Agent, or Firm* — Lewis Roca Rothgerber Christie LLP (57) ABSTRACT

An exemplary embodiment provides a flexible display device including a display panel that includes: a substrate; a plurality of pixel electrodes positioned on the substrate; a pixel defining layer positioned on the substrate and having openings overlapping the plurality of pixel electrodes; a common electrode positioned on the plurality of pixel electrodes; a plurality of emission layers positioned between the plurality of pixel electrodes and the common electrode and overlapping the openings of the pixel defining layer; and a plurality of first linear bars positioned across the substrate. The display panel is bendable in a first direction, and each of the plurality of linear bars continuously extends in a second direction crossing the first direction.

17 Claims, 12 Drawing Sheets

(51) Int. Cl.
  *G06F 3/041*    (2006.01)
  *G06F 3/047*    (2006.01)
  *H01L 27/32*    (2006.01)
  *H01L 51/52*    (2006.01)

(52) U.S. Cl.
  CPC ...... *H01L 51/5203* (2013.01); *H01L 51/5253* (2013.01); *H05K 1/0281* (2013.01); *H05K 1/0393* (2013.01); *G02F 2201/121* (2013.01)

(56) References Cited

U.S. PATENT DOCUMENTS

| | | | |
|---|---|---|---|
| 2012/0212433 A1* | 8/2012 | Lee | G06F 1/1652 345/173 |
| 2016/0363960 A1* | 12/2016 | Park | G06F 1/1656 |
| 2018/0026189 A1* | 1/2018 | Kim | H01L 51/0011 |
| 2018/0035554 A1* | 2/2018 | Liu | H05K 1/028 |
| 2018/0070466 A1* | 3/2018 | Kim | B21B 39/008 |
| 2018/0088736 A1* | 3/2018 | Jeong | G06F 3/0412 |
| 2018/0225804 A1* | 8/2018 | Lu | G06T 3/40 |

FOREIGN PATENT DOCUMENTS

| | | |
|---|---|---|
| KR | 10-0742370 B1 | 7/2007 |
| KR | 10-2014-0014683 A | 2/2014 |
| KR | 10-2014-0064479 A | 5/2014 |

\* cited by examiner

FLEXIBLE DISPLAY DEVICE

CROSS-REFERENCE TO RELATED APPLICATION

This application claims priority to and the benefit of Korean Patent Application No. 10-2017-0140142, filed on Oct. 26, 2017 in the Korean Intellectual Property Office, the entire content of which is incorporated herein by reference.

BACKGROUND

1. Field

Aspects of embodiments of the present disclosure relate to a flexible display device.

2. Description of the Related Art

A display device, such as an organic light emitting diode display, a liquid crystal display, and the like, includes a display panel, and the display panel is manufactured by forming several layers and elements on a substrate. Glass may be used as the substrate of the display panel. However, since the glass substrate is rigid, it is difficult to deform the display device. Recently, a flexible display device using a flexible substrate that is light and easy to deform has been developed.

The flexible display device may be classified into a bendable display device, a foldable display device, a rollable display device, and a stretchable display device depending on its application and form. In order to flexibly deform the flexible display device, a rigid material such as glass may not be used as a cover window or a protector of the display panel, and a flexible polymer film may be used instead of the rigid material. However, the polymer film is very sensitive to impact. Therefore, for example, when an impact is applied to a screen of the display device, the layers and elements of the display panel may be damaged, and pixels may not normally operate.

The above information disclosed in this Background section is only for enhancement of understanding of the background of the invention and, therefore, it may contain information that does not form the prior art that is already known in this country to a person of ordinary skill in the art.

SUMMARY

According to an aspect of embodiments, a flexible display device with improved impact resistance is provided.

According to one or more embodiments, a flexible display device includes a display panel that includes: a substrate; a plurality of pixel electrodes positioned on the substrate; a pixel defining layer positioned on the substrate and having openings overlapping the plurality of pixel electrodes; a common electrode positioned on the plurality of pixel electrodes; a plurality of emission layers positioned between the plurality of pixel electrodes and the common electrode and overlapping the openings of the pixel defining layer; and a plurality of first linear bars positioned across the substrate. The display panel is bendable in a first direction, and each of the plurality of linear bars continuously extends in a second direction crossing the first direction.

The display panel may include a display area and a non-display area around the display area, and each of the plurality of first linear bars may extend in the second direction completely across the display area.

Each of the plurality of first linear bars may extend in the second direction completely across both the display area and the non-display area.

The plurality of first linear bars may be positioned on the pixel defining layer.

The plurality of first linear bars may be positioned between the pixel defining layer and the common electrode.

Each of the plurality of first linear bars may be positioned between adjacent openings of the pixel defining layer.

The plurality of first linear bars may not overlap the openings of the pixel defining layer.

A width of each of the plurality of first linear bars may be smaller than a height thereof.

Each of the plurality of first linear bars may have a width of about 0.2 to about 1 micrometers and a height of about 1 to about 3 micrometers.

First linear bars of the plurality of first linear bars may be made of a metal material.

The display panel may further include a thin film encapsulation layer positioned on the common electrode, and a plurality of second linear bars positioned on the thin film encapsulation layer.

Each of the plurality of second linear bars may continuously extend in the second direction.

The plurality of second linear bars may overlap the plurality of first linear bars.

The display panel may further include a touch sensor layer, and the touch sensor layer may include the plurality of second linear bars as touch electrodes.

The display panel may further include a protective film positioned on the thin film encapsulation layer.

The display panel may further include an elastic film positioned on the protective film.

The plurality of first linear bars may be positioned between the pixel defining layer and the substrate.

Opposite ends of each of the plurality of first linear bars may be in contact with the substrate.

According to embodiments, by forming linear bars crossing a display panel in a direction intersecting a bending direction of a flexible display device in the display panel, it is possible to improve impact resistance characteristics of the display panel without deteriorating flexible characteristics of the flexible display device.

DETAILED DESCRIPTION

The present invention will be described more fully herein with reference to the accompanying drawings, in which some exemplary embodiments of the invention are shown.

As those skilled in the art would realize, the described embodiments may be modified in various different ways, all without departing from the spirit or scope of the present invention.

To more clearly describe the present invention, portions which do not relate to the description may be omitted, and like reference numerals designate like elements throughout the specification.

The size and thickness of each component shown in the drawings may be arbitrarily shown for better understanding and ease of description, but the present invention is not limited thereto. In the drawings, the thicknesses of layers, films, panels, regions, etc. may be exaggerated for clarity. For better understanding and ease of description, the thicknesses of some layers and areas may be exaggerated.

It is to be understood that when an element such as a layer, film, region, or substrate is referred to as being "on" another element, it can be directly on the other element or one or more intervening elements may also be present. In contrast, when an element is referred to as being "directly on" another element, there are no intervening elements present.

In addition, unless explicitly described to the contrary, the word "comprise" and variations such as "comprises" or "comprising" are to be understood to imply the inclusion of stated elements but not the exclusion of any other elements.

Throughout the specification, the phrase "on a plane" means viewing the object portion from the top, and the phrase "on a cross-section" means viewing a cross-section of which the object portion is vertically cut from the side.

A display device according to an exemplary embodiment of the present invention will now be described with reference to the accompanying drawings.

Figure 1:
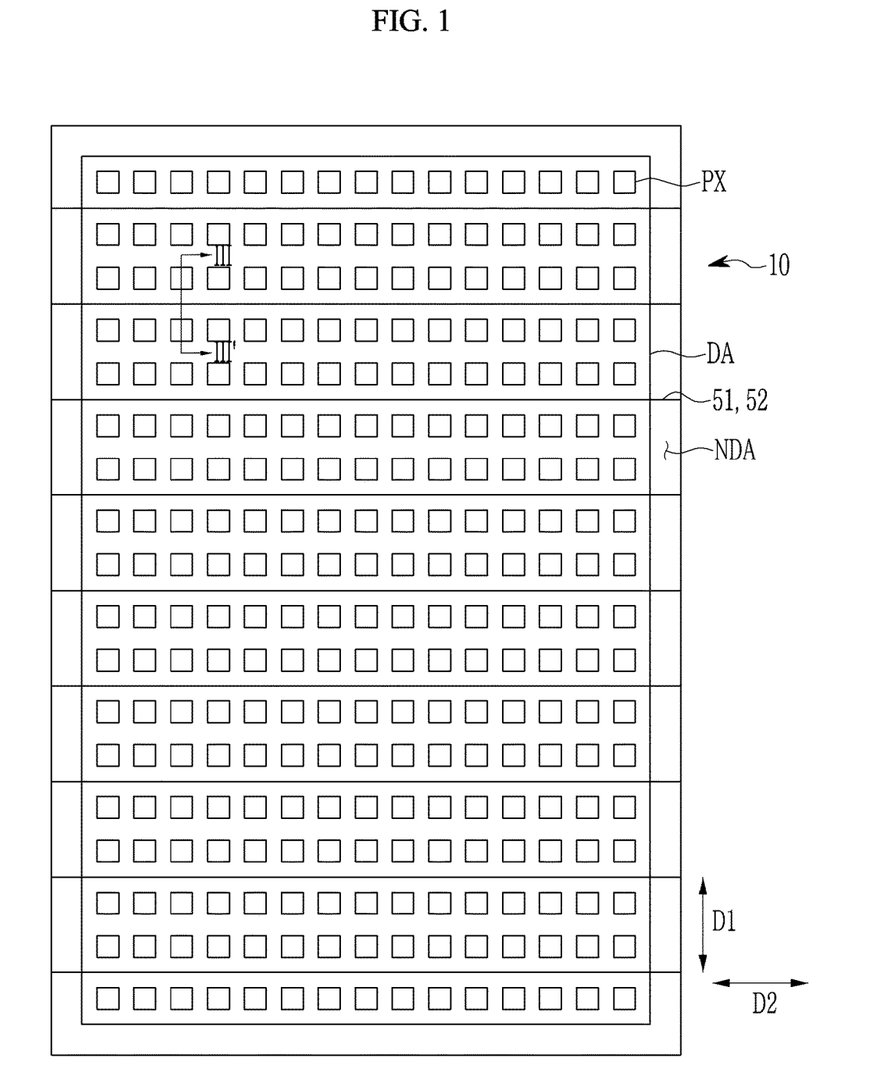
FIG. 1 illustrates a schematic top plan view of a display device according to an exemplary embodiment.
Figure 2A:
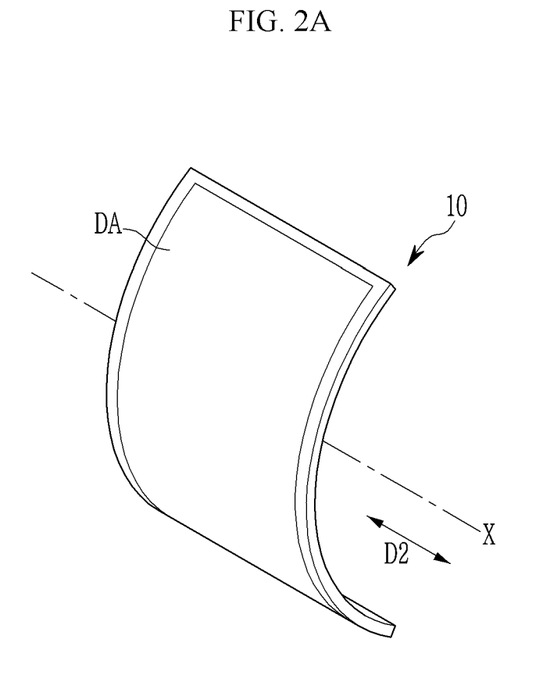
FIGS. 2A and 2B schematically illustrate states in which the display device of FIG. 1 is bent.
Figure 2B:
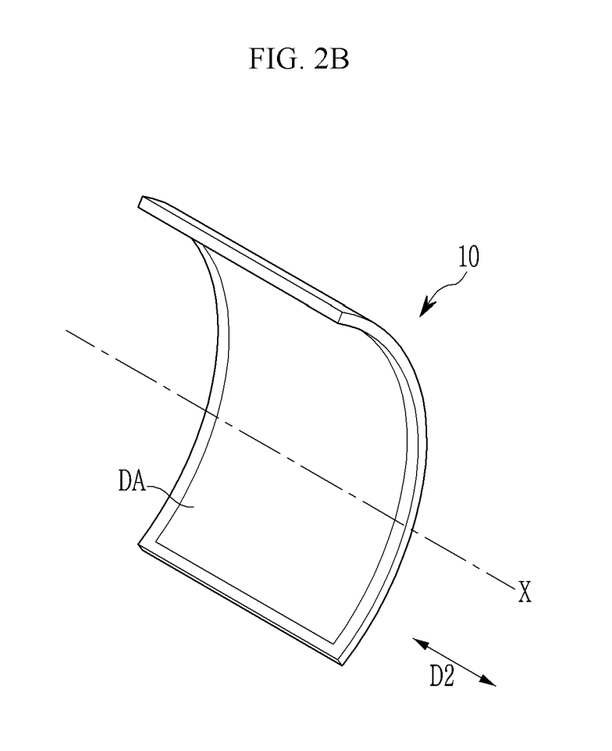
Figure 3:
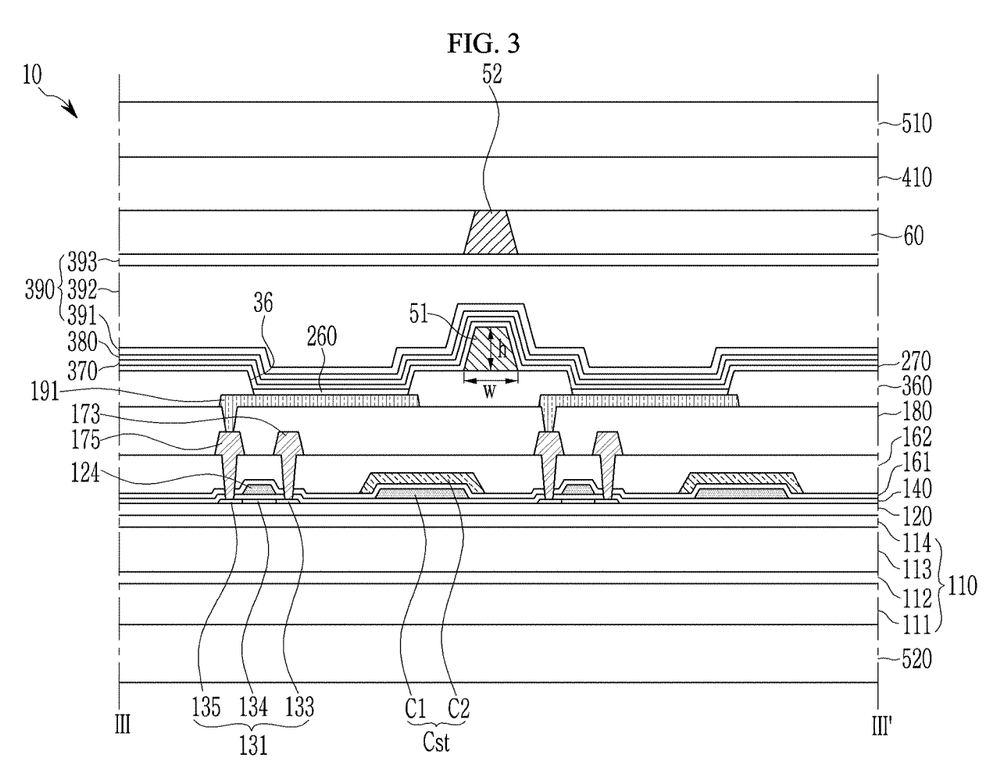
FIG. 3 illustrates a cross-sectional view taken along the line III-Ill' of FIG. 1.

FIG. 1 illustrates a schematic top plan view of a display device according to an exemplary embodiment; FIGS. 2A and 2B schematically illustrate states in which the display device of FIG. 1 is bent; and FIG. 3 illustrates a cross-sectional view taken along the line III-III' of FIG. 1.

Referring to FIG. 1, a display device according to an exemplary embodiment includes a display panel 10 having a substantially rectangular planar shape as a whole. The display panel 10 may be bent, folded, or rolled in at least one direction. In the shown exemplary embodiment, the display panel 10 may be bent, folded, or rolled in a first direction D1 with respect to an axis parallel to a second direction D2. Herein, for convenience of explanation, the direction in which the display panel 10 is bent, folded, or rolled will be simply referred to as a bending direction. A bending axis that is a center of the bending may be a virtual axis or a physical axis, and the bending axis may be positioned in front of the display panel 10 (at a position in which a screen thereof is positioned) or at a rear thereof. For example, the display panel 10, as shown in FIG. 2A, may be bent based on a virtual bending axis X positioned at a rear side of the display panel 10, or as shown in FIG. 2B, may be bent based on a virtual bending axis X positioned at a front side of the display panel 10. The display device may include a case, a frame, or the like that may accommodate or fix at least some of the display panel 10.

In an embodiment, the display panel 10 includes a display area DA for displaying an image, and a non-display area NDA positioned at an outer circumference of the display area DA, in which elements and/or wires for generating and/or transmitting various signals that are applied to the display area DA are disposed.

Pixels PX are disposed in the display area DA of the display panel 10 in a predetermined form, for example, in a matrix form. The pixel PX is a minimum unit capable of displaying light and darkness, and, in an embodiment, the pixels PX may include red pixels, green pixels, and blue pixels. In an embodiment, as shown in FIG. 1, quadrangular pixels PX of a same size are disposed at a same interval, but sizes and shapes of the pixels PX and intervals therebetween may vary or may not be constant. Signal lines, such as data lines, gate lines, and driving voltage lines, are also disposed in the display area DA. In an embodiment, the data lines and the driving voltage lines may substantially extend in the first direction D1, and the gate lines may extend in the second direction D2 that intersects the first direction D1. Each pixel PX is connected to the gate line, the data line, and the driving voltage line to be able to receive a gate signal, a data signal, and a driving voltage therefrom.

In an embodiment, the display panel 10 may include a touch sensor layer provided with touch electrodes for sensing a contact or non-contact touch of a user, and the touch electrodes may be generally positioned in the display area DA.

In an embodiment, a pad portion (not shown) including pads for receiving signals from the outside may be positioned in the non-display area NDA of the display panel 10, and the pad portion may be bonded to a flexible printed circuit film. As driving devices for generating and/or processing various signals for driving the display panel 10, a data driver for generating a data signal applied to the data line, a gate driver for generating a gate signal applied to the gate line, and a signal controller for generating a control signal for controlling the data driver and the gate driver may be included. The driving devices may be separately or in combination integrated in the display panel 10, or they may be mounted on the display panel 10 or the flexible printed circuit film in a type of an integrated circuit chip.

In the display panel 10, linear bars 51 and 52 extend in the second direction D2. That is, the linear bars 51 and 52 extend to be parallel to the bending axis X, and extend in a direction intersecting the bending direction. In an embodiment, one of each of the linear bars 51 and 52 may be positioned per two pixels PX in the first direction D1, but the present invention is not limited thereto, and one of each thereof may be positioned per one pixel PX in the first direction D1, or one of each thereof may be positioned per three or more pixels PX in the first direction D1. In an embodiment, the linear bars 51 and 52 may be positioned at same intervals in the first direction D1 but, in another embodiment, may be positioned at different intervals. In an embodiment, the linear bars 51 and 52 may not overlap the pixel PX, and may be positioned between two pixels PX adjacent in the first direction D1. In an embodiment, the linear bars 51 and 52 are formed across an entire width of the display panel 10 while crossing the display area DA and the non-display area NDA of the display panel 10 in the second direction D2. As described later with reference to FIG. 3, the linear bars 51 and 52 may include a linear bar 51 positioned on a pixel defining layer 360 and a linear bar 52 positioned on an encapsulation layer 390.

When the display panel is impacted or compressed, impact or pressure energy may propagate inside the display panel, thereby damaging the elements inside the display panel (for example, such that any of a transistor, an emission layer, a signal line, etc. is broken). If a high modulus film is used as a passivation film provided on the encapsulation layer, it is possible to increase impact resistance of the display panel, but since core stiffness of the display panel also increases, it may be difficult to bend the display panel.

According to an exemplary embodiment, it is possible to increase the impact resistance over the entire surface of the display panel 10 by forming the linear bars 51 and 52 with a high modulus material across the display panel 10 at intervals (e.g., predetermined intervals). Further, since the linear bars 51 and 52 are formed so as to extend in the direction intersecting the bending direction of the display panel 10, it is possible to increase strength of the display panel 10 in the bending direction of the display panel 10 without affecting flexibility thereof.

As a high modulus material forming the linear bars 51 and 52, a metal may be used. For example, the linear bars 51 and 52 may include a metal, such as molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), copper (Cu), and the like, or a metal alloy thereof. Since stiffness of an object is proportional to the modulus thereof, the linear bars 51 and 52 made of a high modulus material may increase the stiffness of the display panel 10, thereby increasing the impact resistance of the display panel 10. Therefore, it is possible to protect the display panel 10 from external impact or the like, such that the pixels and the like inside the display panel 10 may not be damaged. In addition, since the linear bars 51 and 52 are formed in the direction intersecting the bending direction, the bending of the display panel 10 may not be limited.

Referring to FIG. 3, a cross-sectional structure of the display panel 10 is shown. The display panel 10 includes a substrate 110 and a plurality of layers, wires, and elements that are formed thereon. Each pixel may include a plurality of transistors, but one transistor connected to a pixel electrode 191 will be mainly described.

The substrate 110 may be a flexible substrate. In an embodiment, the substrate 110 includes base layers 111 and 113 that may be made of a polymer, such as polyimide, polyamide, polycarbonate, or polyethylene terephthalate, but the present invention is not limited thereto. In an embodiment, the substrate includes a barrier layer 112 positioned between the base layer 111 and the base layer 113, and a barrier layer 114 positioned on the base layer 113. Accordingly, the substrate 110 may have a structure in which the base layers 111 and 113 and the barrier layers 112 and 114 are alternately stacked, but is not limited thereto. The barrier layers 112 and 114 may prevent or substantially prevent water, oxygen, and the like from penetrating. In an embodiment, the barrier layers 112 and 114 may include a silicon oxide (SiOx), a silicon nitride (SiNx), an amorphous semiconductor, and the like.

A buffer layer 120 is positioned on the substrate 110. The buffer layer 120 may serve to block impurities capable of diffusing from the substrate 110 to a semiconductor layer 131 during a process of forming the semiconductor layer 131, and may serve to reduce stress applied to the substrate 110. The buffer layer 120 may increase adhesion of the semiconductor layer 131. In an embodiment, the buffer layer 120 may include an inorganic insulating material, such as a silicon oxide (SiOx), a silicon nitride (SiNx), and the like.

The semiconductor layer 131 of the transistor is positioned on the buffer layer 120. The semiconductor layer 131 includes a channel region 134 overlapping with a gate electrode 124, and a source region 133 and a drain region 135 positioned at opposite sides of the channel region 134 and doped. In an embodiment, the semiconductor layer 131 may include polysilicon, amorphous silicon, or an oxide semiconductor.

A first insulating layer 140 is positioned on the semiconductor layer 131, and a first gate conductor including the gate electrode 124 of the transistor, a first electrode C1 of a storage capacitor Cst, a gate line, and the like is positioned on the first insulating layer 140.

A second insulating layer 161 is positioned on the first gate conductor, and a second gate conductor including a second electrode C2 of the storage capacitor Cst and the like is positioned on the second insulating layer 161.

In an embodiment, the first insulating layer 140 and the second insulating layer 161 may include an inorganic insulating material, such as a silicon oxide, a silicon nitride, and the like. The first gate conductor and the second gate conductor may include a metal, such as molybdenum (Mo), copper (Cu), aluminum (Al), silver (Ag), chromium (Cr), tantalum (Ta), or titanium (Ti), or a metal alloy thereof. The gate electrode 124 may overlap the channel region 134 of the semiconductor layer 131.

A third insulating layer 162 is positioned on the second gate conductor. In an embodiment, the third insulating layer 162 may include an inorganic insulating material, such as a silicon oxide, a silicon nitride, and the like, or may include an organic insulating material, such as polyimide, an acryl-based polymer, and a siloxane-based polymer.

A data conductor including a source electrode 173 and a drain electrode 175 of the transistor, a data line (not shown), and a driving voltage line (not shown) is positioned on the third insulating layer 162. The source electrode 173 and the drain electrode 175 are respectively connected to the source region 133 and the drain region 135 of the semiconductor layer 131 through contact holes formed in the third insulating layer 162, the second insulating layer 161, and the first insulating layer 140. In an embodiment, the data conductor may include a metal, such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, and a metal alloy thereof.

The gate electrode 124, the source electrode 173, and the drain electrode 175 form the transistor together with the semiconductor layer 131. In an embodiment, the transistor may be a driving transistor or an emission control transistor for a pixel of an organic light emitting device. In an embodiment, the transistor may be a top-gate type of transistor in which the gate electrode 124 is positioned above than the semiconductor layer 131, but a structure of the transistor may be variously modified.

A planarization layer 180 capable of including an organic insulating material is positioned on the third insulating layer 162 and the data conductor. The pixel electrode 191 is positioned on the planarization layer 180. The pixel electrode 191 of each pixel PX may be connected to the drain electrode 175 of the transistor through a contact hole formed in the planarization layer 180. The pixel electrode 191 may include a reflective conductive material or a transflective conductive material, and may include a transparent conductive material.

The pixel defining layer 360 with an opening 36 overlapping the pixel electrode 191 is positioned on the planarization layer 180. The opening 36 of the pixel defining layer 360 may define each pixel region and, thus, it may correspond to the region of the rectangular pixel PX in a top view (see FIG. 1). The pixel defining layer 360 may include an organic insulating material.

An emission member 260 is positioned on the pixel electrode 191. In an embodiment, the emission member 260 may include a first organic common layer, an emission layer, and a second organic common layer that are sequentially stacked. The first organic common layer may include at least one of a hole injection layer and a hole transporting layer. In an embodiment, the emission layer may be made of an organic material for intrinsically displaying light of any of primary colors such as red, green, and blue, and may have a structure in which a plurality of organic material layers for displaying light of different colors are stacked. The second organic common layer may include at least one of an electron transporting layer and an electron injection layer.

A common electrode 270 for transmitting a common voltage is positioned on the emission member 260. In an embodiment, the common electrode 270 is formed of a transparent conductive material, such as an indium tin oxide (ITO) and an indium zinc oxide (IZO), or may be formed by thinly stacking a metal, such as calcium (Ca), barium (Ba), magnesium (Mg), aluminum (Al), or silver (Ag), to have light permeability. The pixel electrode 191, the emission member 260, and the common electrode 270 of each pixel PX form an organic light emitting diode (OLED).

A linear bar 51 is positioned on the pixel defining layer 360 so as to not overlap the opening 36. The linear bar 51 may be directly positioned on the pixel defining layer 360, and a lower surface of the linear bar 51 may be combined with an upper layer of the pixel defining layer 360. As described above, the linear bar 51 is formed across the display panel 10 in a direction crossing the bending direction of the display panel 10. The linear bar 51 may serve to protect the display panel 10 from an impact applied to the display panel 10.

In an embodiment, the linear bar 51 may have a substantially rectangular or trapezoidal cross-sectional shape, and is formed to have a width (e.g., a predetermined width) (w) and a height (e.g., a predetermined height) (h) on the pixel defining layer 360. Therefore, the linear bar 51 may replace or serve as a spacer. A spacer positioned on the pixel defining layer 360 to have a greater thickness than the pixel defining layer 360 may serve to support a mask, such as a fine metal mask (FMM), used in forming an emission layer, wherein the linear bar 51 may structurally and positionally serve as the spacer.

The bending stiffness is proportional to an area moment of inertia, and the area moment of inertia is proportional to a cube of thickness. Therefore, when the height (h) of the linear bar 51 is formed to be larger than the width (w) thereof, the stiffness may be further increased, and the impact resistance may also be increased. In an embodiment, for example, the linear bar 51 may have a width (w) of about 0.2 to about 1 micrometer and a height (h) of about 1 to about 3 micrometers, and, in an embodiment, a width (w) of about 0.4 to about 0.6 micrometers and a height (h) of about 1 to about 1.6 micrometers.

In an embodiment, the common electrode 270 positioned on the pixel defining layer 360 and the emission member 260 may be positioned to cover the linear bar 51. Therefore, the linear bar 51 may be positioned between the pixel defining layer 360 and the common electrode 270, and may be substantially surrounded by the pixel defining layer 360 and the common electrode 270.

In an embodiment, a capping layer 370 and/or a functional layer 380 may be positioned on the common electrode 270. The capping layer 370 may serve to increase light efficiency through adjustment of the refractive index. The functional layer 380 may serve to prevent or substantially prevent damage to lower layers thereof when the encapsulation layer 390 is formed, and may serve to increase light efficiency.

The encapsulation layer 390 is positioned on the functional layer 380. The encapsulation layer 390 may prevent or substantially prevent moisture or oxygen from penetrating from the outside by encapsulating the emission member 260 and the common electrode 270. In an embodiment, the encapsulation layer 390 may have a structure in which layers 391 and 393 including an inorganic material and a layer 392 including an organic material are alternately stacked.

In an embodiment, the linear bar 52 may be positioned on the encapsulation layer 390. Similar to the linear bar 51, the linear bar 52 is formed across the display panel 10 in a direction crossing the bending direction in the display panel 10. In an embodiment, a material, a size, and function of the linear bar 52 may correspond to those of the linear bar 51, such that a further description thereof will be omitted. In an embodiment, the linear bar 52 may overlap the linear bar 51, but, in another embodiment, may not overlap the linear bar 51. For example, the linear bar 52 may be positioned between the pixels PX at which the linear bar 51 is not positioned.

A protective film 410 covering the encapsulation layer 390 may be positioned on the linear bar 52. The protective film 410 may serve to protect the display panel 10 from an impact or the like. In an embodiment, for example, the protective film 410 may have a thickness of about 10 to 500 micrometers, and, in an embodiment, a thickness of about 20 to 50 micrometers. In an embodiment, the protective film 410 may include a polymer, such as polyimide, polyethylene terephthalate, and polyethylene naphthalate, or may include a metal, such as stainless steel. The linear bar 52 allows the protective film 410 to be substantially separated from the encapsulation layer 390 by a height of the linear bar 52, and the separated space may be filled with an optically clear filler 60, such as an organic material. The protective film 410 may be bonded by an adhesive, such as a pressure sensitive adhesive (PSA) or an optically clear adhesive (OCA), and the optically clear filler 60 may be the OCA.

In an embodiment, the linear bar 51 and the linear bar 52 may form a capacitance touch sensor. For example, by inputting a driving signal to one of the linear bar 51 or the linear bar 52, and then by detecting a change of a charge amount due to a touch of an external object from a signal outputted from the other, a touch may be detected.

In an embodiment, an elastic film 510 may be positioned on the protective film 410, and an elastic film 520 may be positioned below the substrate 110. The elastic films 510 and 520 may serve to protect the display panel 10, and may serve to increase resilience (i.e. a force for returning to an unfolded state) in the bending of the display panel 10. For example, when the display device is a rollable display device, the resilience may be important. In an embodiment, the elastic films 510 and 520 may be bonded by an adhesive, such as the PSA and the OCA, and may be formed by coating and curing a precursor. In an embodiment, the elastic films 510 and 520 may have, for example, a thickness of about 10 to 500 micrometers, and, in an embodiment, about 50 to about 200 micrometers. In an embodiment, the elastic films 510 and 520 may include, for example, thermoplastic rubber, elastolefin, thermoplastic olefin, thermoplastic polyurethane, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomer, ethylene-vinyl acetate, or the like. In an embodiment, although not shown, a protective film, such as the protective film 410, may be positioned between the substrate 110 and the elastic film 520.

Now, while focusing on a process for forming the linear bar 51 positioned on the pixel defining layer 360, a manufacturing method of the display device described above will be described with reference to FIG. 4 to FIG. 7.

FIG. 4 to FIG. 7 illustrate process cross-sectional views of a manufacturing method of a display device according to an exemplary embodiment, respectively.

Figure 4:
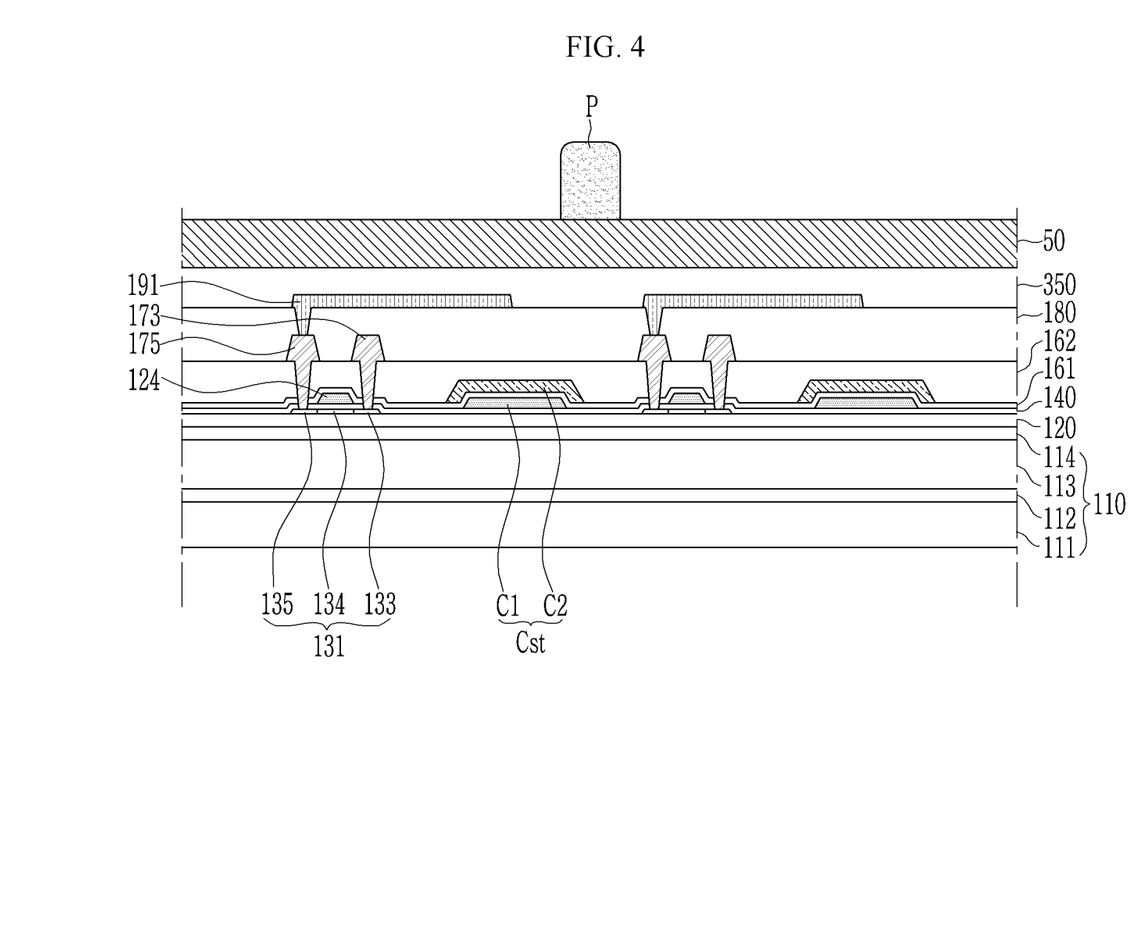
FIG. 4 to FIG. 7 illustrate process cross-sectional views of a manufacturing method of a display device according to an exemplary embodiment, respectively.

Referring to FIG. 4, the constituent elements of the display panel 10 are sequentially formed on the substrate 110 from the buffer layer 120 to the pixel electrode 191 through a method known in the art. Then, a photosensitive organic material layer 350 and a metal layer 50 are sequentially formed on the pixel electrode 191 and the planarization layer 180. Next, by forming a photosensitive material layer such as a photoresist and then patterning it, a photosensitive film pattern P corresponding to a position for the linear bar 51 to be formed is formed.

Figure 5:
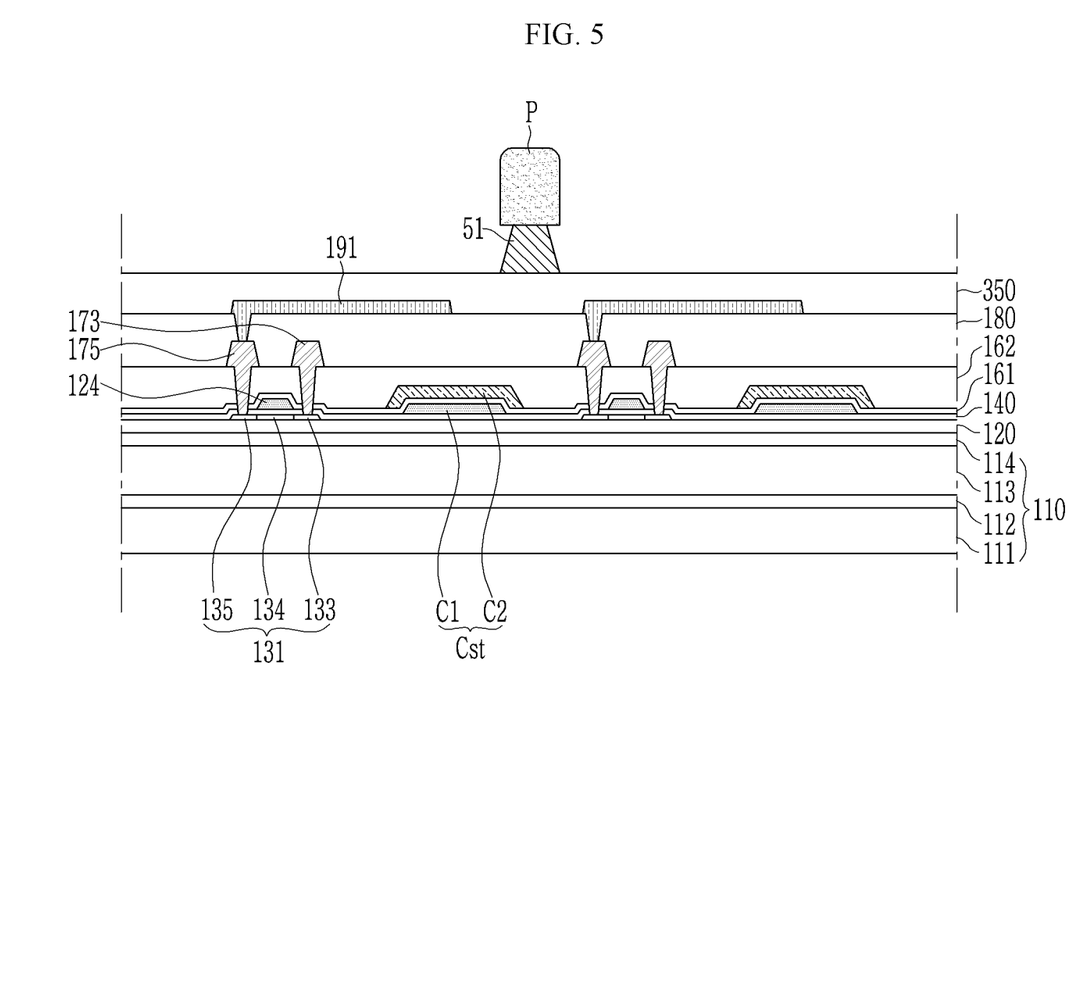

Referring to FIG. 5, the metal layer 50 is etched using the photosensitive film pattern P as a mask to form the linear bar 51 capable of intersecting the bending direction of the display panel 10 and crossing a width (e.g., the entire width) of the display panel 10. Although a dry etching method may be used as an etching method, a wet etching method may be used herein.

Figure 6:
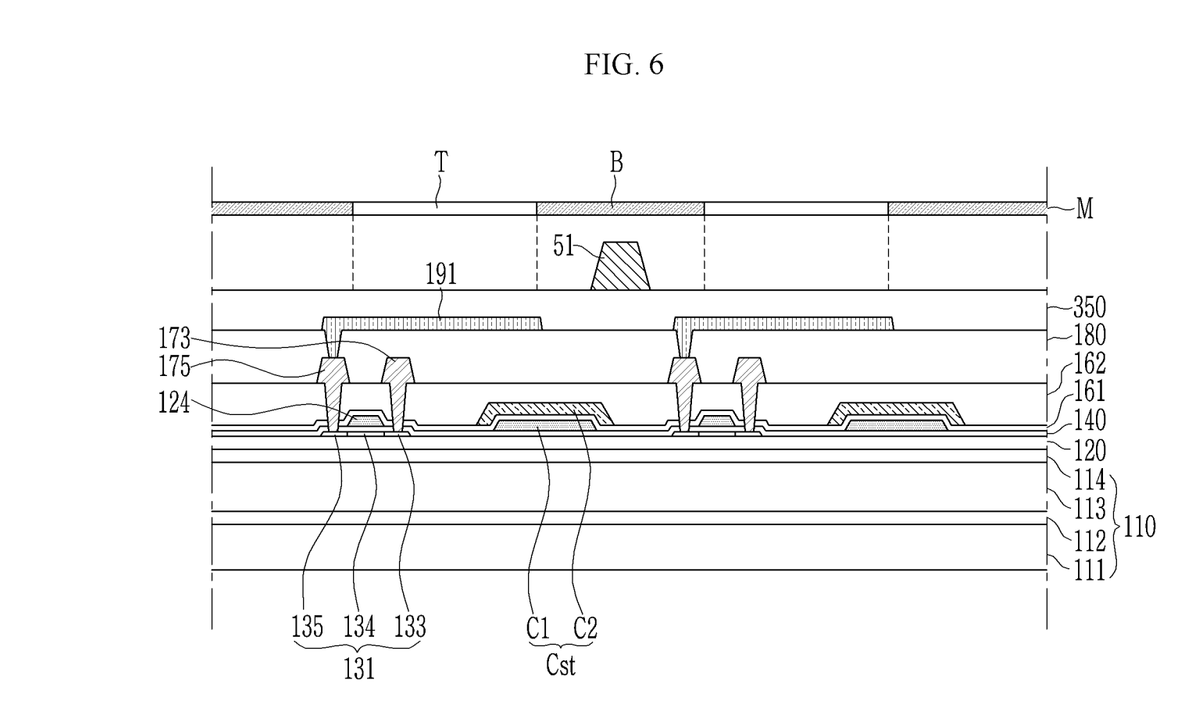
Figure 7:
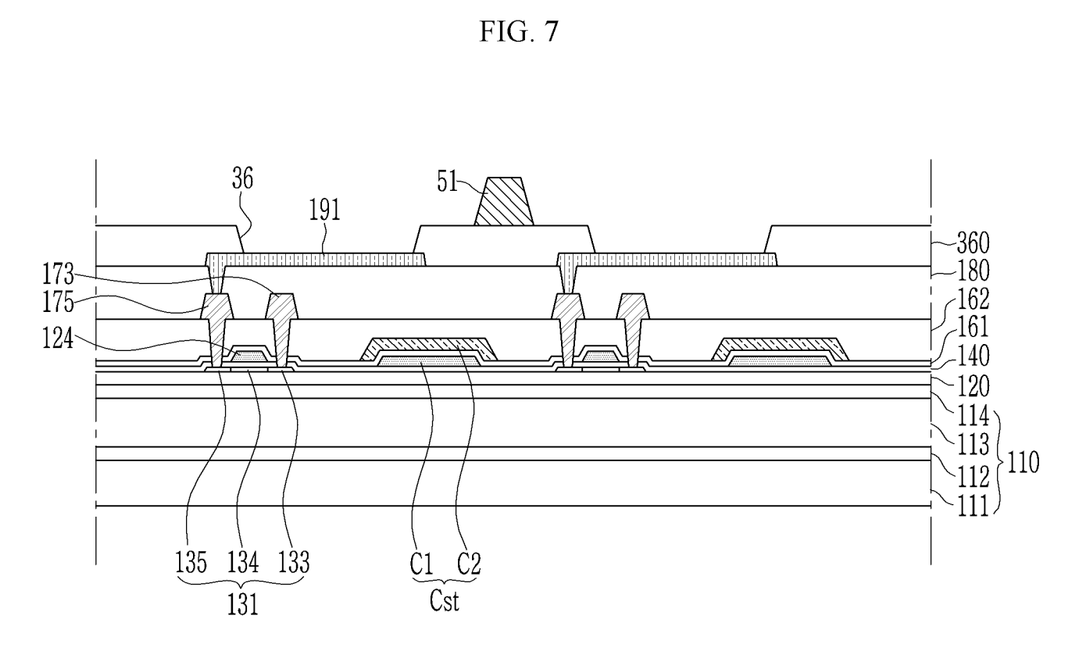

Referring to FIG. 6 and FIG. 7, when the photosensitive organic material layer 350 has positive photosensitivity, the photosensitive organic material layer 350 may be exposed using a mask M having a light transmitting region T corresponding to the opening 36 of the pixel defining layer 360 and then may be developed to form the pixel defining layer 360 having the opening 36. Therefore, even if the linear bar 51 is positioned on the pixel defining layer 360, the pixel defining layer 360 having the opening 36 may be formed after the linear bar 51 is completely formed in a process therefor. When the photosensitive organic material layer 350 has negative photosensitivity, the light transmitting region T and a light blocking region B of the mask M may be arranged opposite to the arrangement described above.

Next, by forming the emission member 260 overlapping the opening 36 of the pixel defining layer 360 and then by sequentially forming or attaching the common electrode 270 and the like thereon in a general method, the display panel 10 as shown in FIG. 3 may be manufactured.

In another embodiment, the linear bar 51 may be formed in a different method from that described above. For example, the linear bar 51 may be formed by printing and spark plasma sintering (SPS). More specifically, a metal powder may be mixed with a solution (e.g., a viscous solution) to form a paste, and after printing it on the pixel defining layer 360 and then curing it using the SPS, the linear bar 51 may be formed. Since the SPS is performed very quickly, the linear bar 51 may be formed without damaging lower layers, such as an OLED.

Herein, display devices according to some exemplary embodiments will be described with a focus on differences from the exemplary embodiment described above.

Figure 8:
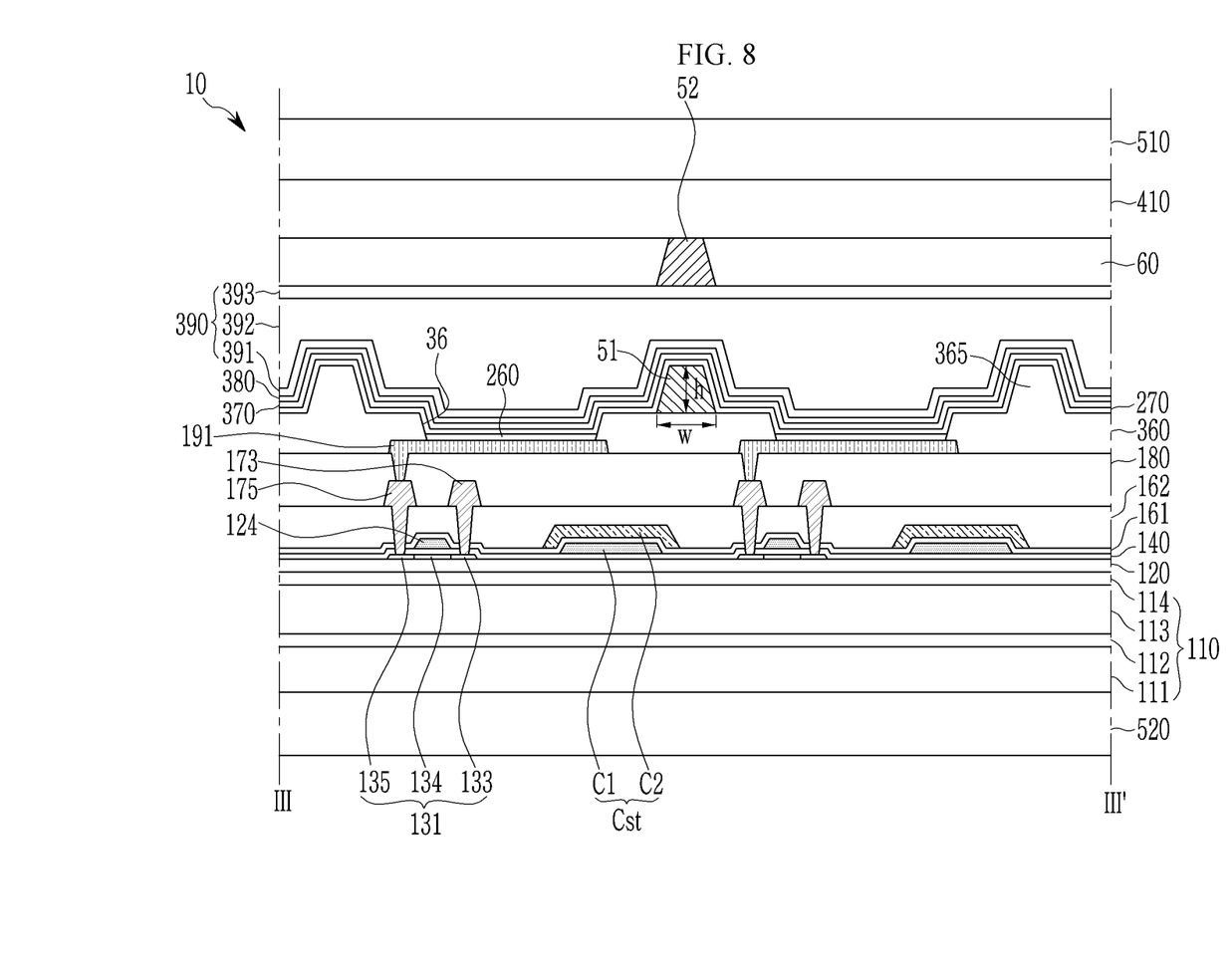
FIG. 8 to FIG. 10 illustrate cross-sectional views taken along a line corresponding to the line III-III' of FIG. 1, respectively, according to exemplary embodiments.
Figure 9:
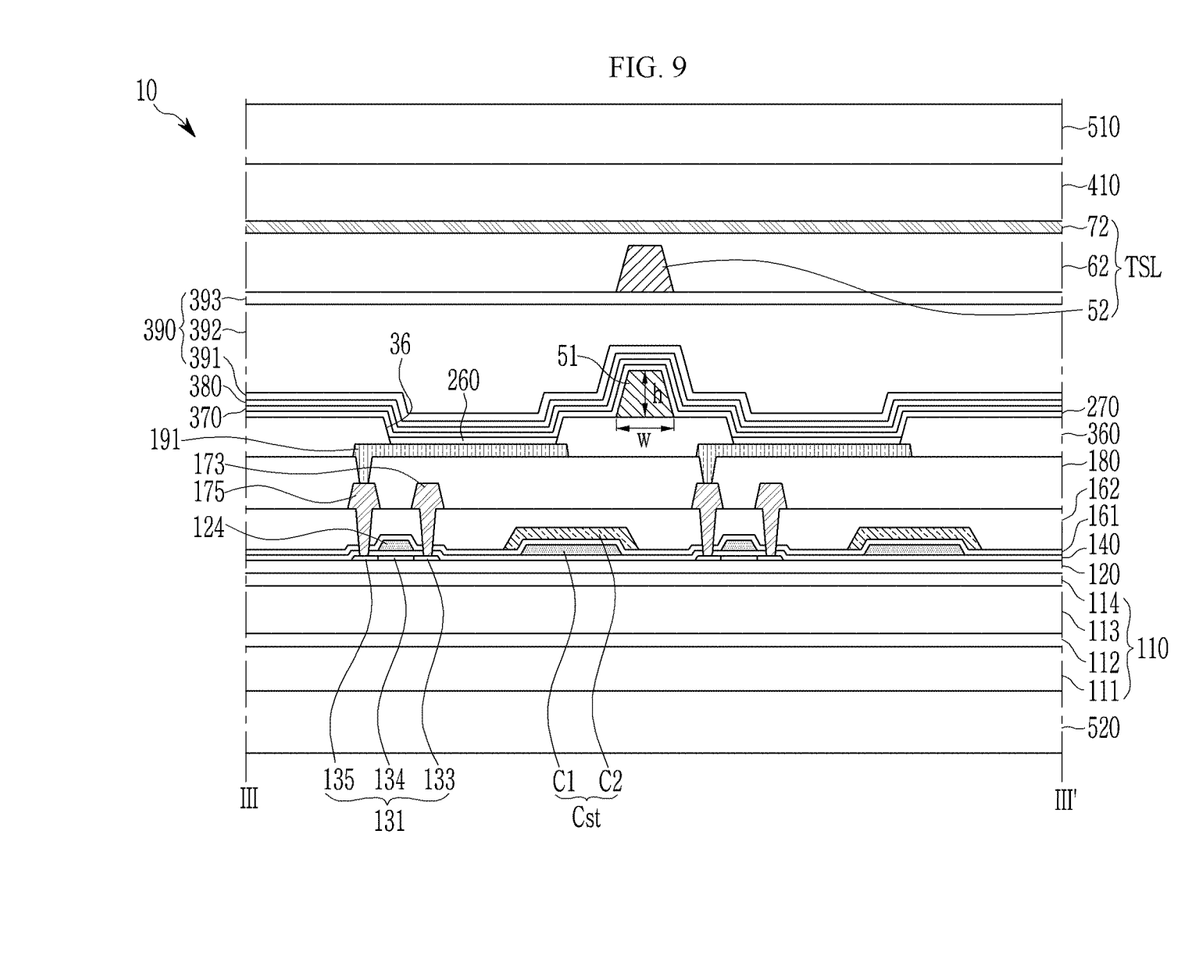
Figure 10:
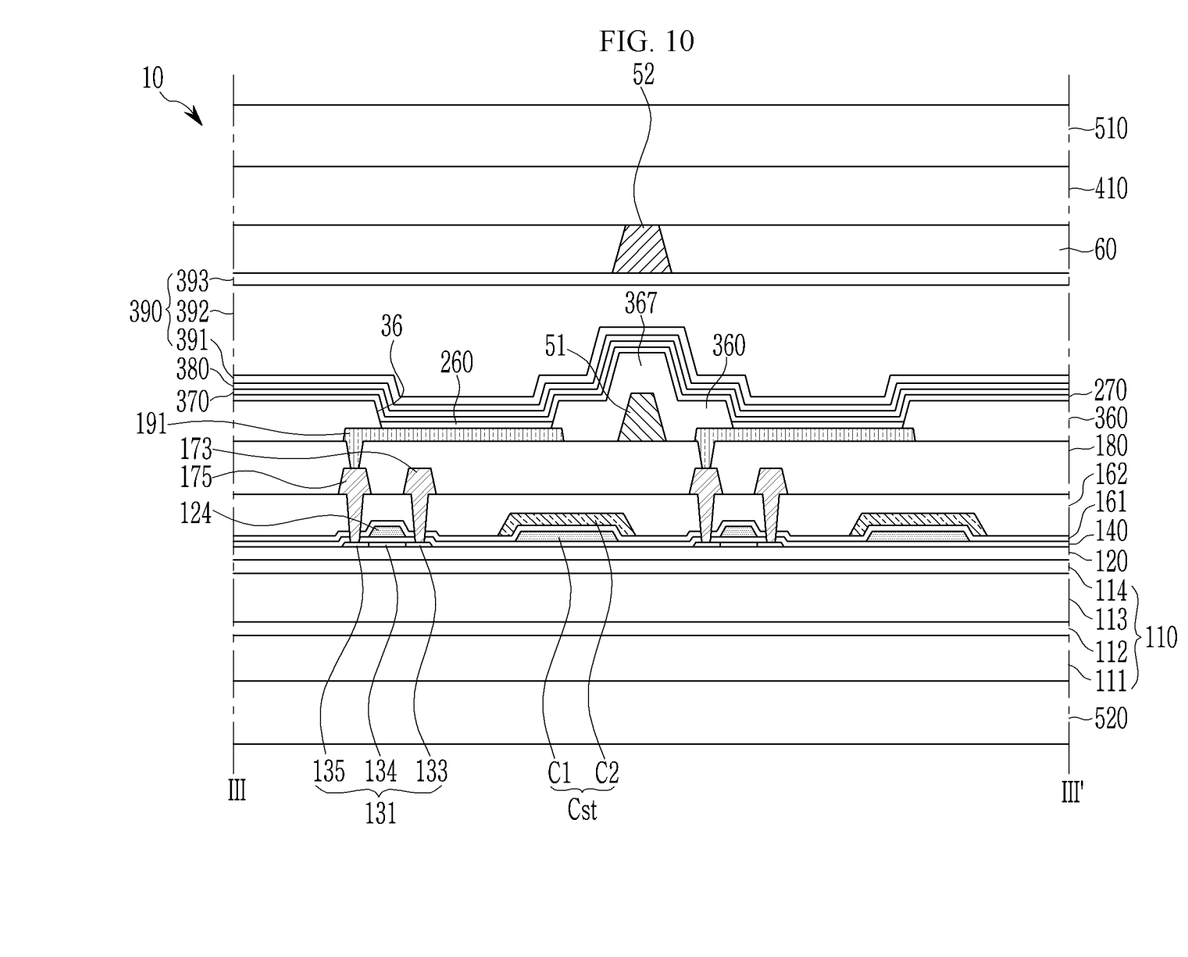

FIG. 8 to FIG. 10 illustrate cross-sectional views taken along a line corresponding to the line III-III' of FIG. 1, respectively, according to exemplary embodiments.

Referring to FIG. 8, the display panel 10 includes a spacer 365 positioned on the pixel defining layer 360. The spacer 365 may be positioned between adjacent pixels PX. In an embodiment, for example, the linear bars 51 and 52 and the spacer 365 may be alternately positioned between adjacent pixels PX in the first direction D1. In an embodiment, unlike the linear bar 51 which is continuously formed in the second direction D2, the spacer 365 may be discontinuously formed, that is, in a shape of an island. The spacer 365 may be positioned between adjacent pixels PX in the second direction D2. The spacer 365 may be formed of a same material as the pixel defining layer 360. For example, after the photosensitive organic material layers are stacked, the pixel defining layer 360 and the spacer 365 having a different height may be formed together by using a halftone mask or a slit mask. Even if the spacer 365 is formed, the linear bar 51 may serve as a spacer in a place in which the spacer 365 is not formed, that is, the linear bar 51 may serve to support a mask while increasing the impact resistance of the display panel 10.

Referring to FIG. 9, in an embodiment, the display panel 10 includes a touch sensor layer TSL between the encapsulation layer 390 and the protective film 410. The touch sensor layer TSL includes the linear bar 52 on the encapsulation layer 390, and a touch electrode 72 on an insulating layer 62 as touch electrodes for forming a touch sensor of a mutual capacitor type. One of the linear bar 52 and the touch electrode 72 may receive a driving signal, and the other thereof may output a sensing signal that varies depending on whether a touch exists. In the present exemplary embodiment, the linear bar 52 for enhancing the impact resistance of the display panel 10 is also utilized as a touch electrode. The position of the touch sensor layer TSL is not limited to that shown, and may be variously changed.

In the exemplary embodiments described above, the linear bar 51 is positioned between the pixel defining layer 360 and the common electrode 270; however, the linear bar 51 may be positioned elsewhere. In an embodiment, for example, referring to FIG. 10, the linear bar 51 is positioned between the planarization layer 180 and the pixel defining layer 360. In this case, a portion 367 of the pixel defining layer 360 overlapping the linear bar 51 may be formed to be higher than other portions of the pixel defining layer 360 and, thus, may serve as a spacer. In the process therefor, the linear bar 51 may be formed, for example, by printing and SPS after the pixel electrode 191 is formed.

Figure 11:
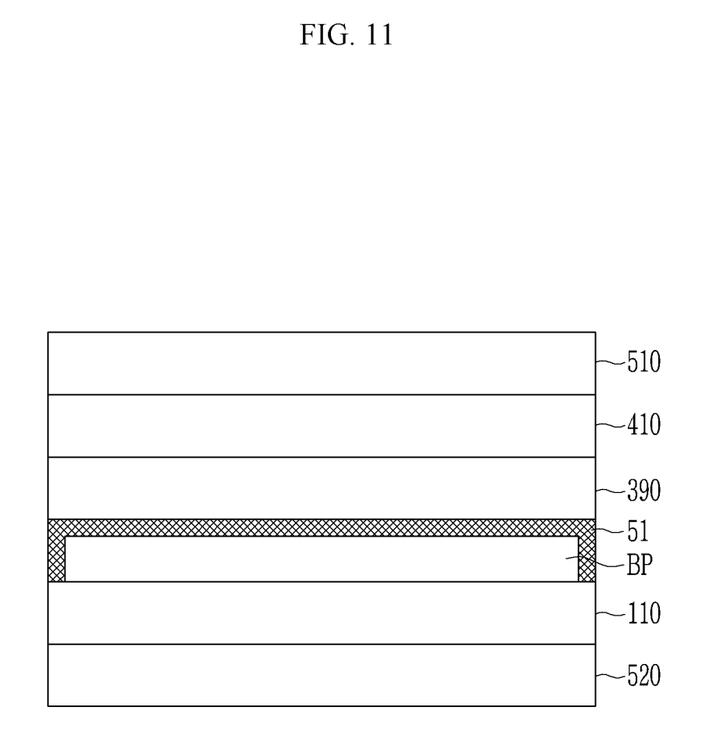
FIG. 11 schematically illustrates an overall cross-sectional view of a display device according to an exemplary embodiment.

FIG. 11 schematically illustrates an overall cross-sectional view of a display device according to an exemplary embodiment.

FIG. 11 simply illustrates layers and elements between the substrate 110 and the encapsulation layer 390 in the display panel 10 as a single layer BP, except for the linear bar 51. The linear bar 51 extends over a width (e.g., the entire width) of the display panel 10 in the second direction D2 intersecting the bending direction. In an embodiment, opposite ends of the linear bar 51 may extend toward the substrate 110 and contact the substrate 110. In this case, the linear bar 51 extends over a lateral surface of the layer BP as well as an upper portion of the layer BP, and, thus, the linear bar 51 may be more effective for protecting the display panel 10 from an impact applied on a screen of the display panel 10 as well as an impact applied on a lateral surface thereof.

While this invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display device comprising a display panel including:
   a substrate;
   a plurality of pixel electrodes positioned on the substrate;
   a pixel defining layer positioned on the substrate and having openings overlapping the plurality of pixel electrodes;
   a common electrode positioned on the plurality of pixel electrodes;

a plurality of emission layers positioned between the plurality of pixel electrodes and the common electrode and overlapping the openings of the pixel defining layer; and a plurality of first linear bars positioned across the substrate, wherein the display panel is bendable in a first direction, and each of the plurality of first linear bars continuously extends in a second direction crossing the first direction, and wherein the plurality of first linear bars is positioned on the pixel defining layer.

2. The flexible display device of claim 1, wherein
the display panel includes a display area and a non-display area around the display area, and
each of the plurality of first linear bars extends in the second direction completely across the display area.

3. The flexible display device of claim 2, wherein each of the plurality of first linear bars extends in the second direction completely across both the display area and the non-display area.

4. The flexible display device of claim 1, wherein the plurality of first linear bars is positioned between the pixel defining layer and the common electrode.

5. A flexible display device comprising a display panel including:
a substrate;
a plurality of pixel electrodes positioned on the substrate;
a pixel defining layer positioned on the substrate and having openings overlapping the plurality of pixel electrodes;
a common electrode positioned on the plurality of pixel electrodes;
a plurality of emission layers positioned between the plurality of pixel electrodes and the common electrode and overlapping the openings of the pixel defining layer; and
a plurality of first linear bars positioned across the substrate,
wherein the display panel is bendable in a first direction, and each of the plurality of first linear bars continuously extends in a second direction crossing the first direction, and
wherein each of the plurality of first linear bars is positioned between adjacent openings of the pixel defining layer.

6. The flexible display device of claim 5, wherein the plurality of first linear bars does not overlap the openings of the pixel defining layer.

7. The flexible display device of claim 1, wherein a width of each of the plurality of first linear bars is smaller than a height thereof.

8. The flexible display device of claim 7, wherein each of the plurality of first linear bars has a width of about 0.2 to about 1 micrometers and a height of about 1 to about 3 micrometers.

9. The flexible display device of claim 1, wherein first linear bars of the plurality of first linear bars are made of a metal material.

10. The flexible display device of claim 1, wherein the display panel further includes:
a thin film encapsulation layer positioned on the common electrode; and
a plurality of second linear bars positioned on the thin film encapsulation layer.

11. The flexible display device of claim 10, wherein each of the plurality of second linear bars continuously extends in the second direction.

12. The flexible display device of claim 10, wherein the plurality of second linear bars overlaps the plurality of first linear bars.

13. The flexible display device of claim 10, wherein
the display panel further includes a touch sensor layer, and
the touch sensor layer includes the plurality of second linear bars as touch electrodes.

14. The flexible display device of claim 10, wherein the display panel further includes a protective film positioned on the thin film encapsulation layer.

15. The flexible display device of claim 14, wherein the display panel further includes an elastic film positioned on the protective film.

16. A flexible display device comprising a display panel including:
a substrate;
a plurality of pixel electrodes positioned on the substrate;
a pixel defining layer positioned on the substrate and having openings overlapping the plurality of pixel electrodes;
a common electrode positioned on the plurality of pixel electrodes;
a plurality of emission layers positioned between the plurality of pixel electrodes and the common electrode and overlapping the openings of the pixel defining layer; and
a plurality of first linear bars positioned across the substrate,
wherein the display panel is bendable in a first direction, and each of the plurality of first linear bars continuously extends in a second direction crossing the first direction, and
wherein the plurality of first linear bars is positioned between the pixel defining layer and the substrate.

17. The flexible display device of claim 1, wherein opposite ends of each of the plurality of first linear bars are in contact with the substrate.

* * * * *